United States Patent
Shimizu et al.

(10) Patent No.: US 7,344,597 B2
(45) Date of Patent: *Mar. 18, 2008

(54) VAPOR-PHASE GROWTH APPARATUS

(75) Inventors: Eiichi Shimizu, Toda (JP); Nobuhito Makino, Toda (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 488 days.

This patent is subject to a terminal disclaimer.

(21) Appl. No.: 10/515,970

(22) PCT Filed: Oct. 16, 2002

(86) PCT No.: PCT/JP02/10713

§ 371 (c)(1),
(2), (4) Date: Nov. 29, 2004

(87) PCT Pub. No.: WO03/107403

PCT Pub. Date: Dec. 24, 2003

(65) Prior Publication Data

US 2005/0217564 A1    Oct. 6, 2005

(30) Foreign Application Priority Data

Jun. 13, 2002  (JP) .............................. 2002-172391
Aug. 19, 2002  (JP) .............................. 2002-238035

(51) Int. Cl.
*C30B 35/00*  (2006.01)

(52) U.S. Cl. ...................... 117/216; 117/200; 117/217; 117/900

(58) Field of Classification Search ................ 117/200, 117/216, 217, 218, 222, 900
See application file for complete search history.

(56) References Cited

U.S. PATENT DOCUMENTS 5,304,247 A * 4/1994 Kondo et al. ................ 118/715
5,556,500 A * 9/1996 Hasegawa et al. ..... 156/345.27
2001/0052324 A1  12/2001 Roland et al.

FOREIGN PATENT DOCUMENTS

EP  0 502 209 A1  9/1992
EP  0 519 608 A1  12/1992

(Continued)

*Primary Examiner*—Felisa Hiteshew
(74) *Attorney, Agent, or Firm*—Birch, Stewart, Kolasch & Birch, LLP

(57) ABSTRACT

A vapor-phase growth apparatus includes: at least a reaction furnace which is hermetically closable, a wafer container which is disposed in the reaction furnace, for disposing a wafer at a predetermined position, a gas supply member for supplying a source gas toward the wafer, and a heating member for heating the wafer, wherein the apparatus is designed to form a grown film on a front surface of the wafer by supplying the source gas in a high temperature state while the heating member heats the wafer in the reaction furnace through the wafer container. The wafer container is made of a single material or a single member, and has a ratio $R_2/R_1$, which is not less than 0.4 to not more than 1.0, where $R_1$ is a heat resistance for a heat transfer route from a rear surface of the wafer container toward the front surface of the wafer, and $R_2$ is a heat resistance for a heat transfer route from the rear surface of the wafer container toward a front surface of the wafer container.

4 Claims, 4 Drawing Sheets

FOREIGN PATENT DOCUMENTS

| | | |
|---|---|---|
| JP | 55-10436 A | 1/1980 |
| JP | 61-122195 A | 6/1986 |
| JP | 1-291421 A | 11/1989 |
| JP | 2-82528 A | 3/1990 |
| JP | 03-146672 A | 6/1991 |
| JP | 10-107018 A | 4/1998 |
| JP | 11-16991 A | 1/1999 |
| JP | 11-180796 A | 7/1999 |
| JP | 2000-355766 A | 12/2000 |
| JP | 2001-230234 A | 8/2001 |
| WO | WO-92/05577 A1 | 4/1992 |

* cited by examiner (a)

(b)

VAPOR-PHASE GROWTH APPARATUS

TECHNICAL FIELD

The present invention relates to a vapor-phase growth apparatus for growing a thin film of compound semiconductor or the like on a surface of a wafer in a vapor phase, while heating the wafer under a supply of a source gas in a high temperature state, and in particular to material characteristics of a wafer container for disposing wafers thereon.

BACKGROUND ART

Vapor-phase growth process is currently utilized in various industrial fields. Needless to say in the vapor-phase growth, advanced uniformities in thickness, composition and doping concentration of a film grown on the wafer over the entire surface thereof are an essential matter. Achievement of thermal uniformity in wafer heating is therefore recognized as the most important elementary technology as one means for realizing the aforementioned uniformities over the entire surface.

FIG. 1 is a sectional view showing an exemplary constitution of a general vapor-phase growth apparatus. As shown in FIG. 1, a vapor-phase growth apparatus 100 comprises a reaction furnace 1, a wafer holder 3 for disposing the wafer 2 thereon, a susceptor 4 for placing the wafer holder 3 thereon, a heater 5 disposed below the susceptor 4, a rotary mechanism 6 for supporting the wafer holder 3 and the susceptor 4 to allow them to rotate freely, a gas introducing duct 7 for supplying a source gas and a carrier gas therethrough, and a gas exhaust duct 8 for discharging the non-reacted gas, and the like.

FIG. 2 is an enlarged view for showing a detailed construction of the wafer holder 3, where (a) is a plan view, and (b) is a sectional view taken along the line A-A. In one surface of the wafer holder 3, a plurality of (six in FIG. 2) circular pocket holes 3$a$ are formed for disposing the wafers 2 therein, to be arranged along a single circumference on the surface. The other surface of the wafer holder 3 is in contact with the susceptor 4.

The susceptor 4 herein is made of a material having a large coefficient of thermal conductivity (e.g., molybdenum) in order to uniformly transfer heat from the heater 5. It is also general to use graphite, molybdenum or the like, having a large coefficient of thermal conductivity for the wafer holder 3.

In the vapor-phase growth apparatus having such a structure described above, heat is transferred to the wafer 2 through the susceptor 4 and wafer holder 3 by heating the susceptor 4 from the lower side thereof by using the heater 5, to thereby heat the wafer 2 up to a predetermined temperature. Vapor-phase growth of a thin film is carried out by rotating the susceptor 4 at a predetermined number of rotation with the aid of a rotating mechanism 6 while uniformly supplying source gas and carrier gas, introduced through a gas introducing duct 7 toward the front surface of the wafer 2.

It was, however, found from an experiment of the present inventors that, in the aforementioned vapor-phase growth apparatus 100, the front surface temperature of the wafer 2 became lower than that of the wafer holder 3, and the temperature of the circumferential portion of the wafer 2 consequently became higher than that of the central portion of the wafer 2, by the effect of the temperature of the wafer holder 3. In other words, it was found to be difficult for the conventional vapor-phase growth apparatus 100 to form a thin film with a high uniformity over the entire surface of the wafer 2 by vapor-phase growth since in-plane temperature distribution of the wafer 2 could not be uniform.

The present invention has been developed in order to solve the aforementioned problems. An object of the invention is therefore to provide a vapor-phase growth apparatus which is capable of allowing a thin film to grow in a vapor phase so as to achieve a desirable uniformity over the entire surface of a wafer.

DISCLOSURE OF THE INVENTION

The vapor-phase growth apparatus according to the present invention, comprises: at least a reaction furnace which can be hermetically closed, a wafer container which is disposed in the reaction furnace, for disposing a wafer at a predetermined position thereon, a gas supply member for supplying a source gas toward the wafer, and a heating member for heating the wafer; the apparatus being designed to form a grown film on a front surface of the wafer by heating the wafer in the reaction furnace through the wafer container while supplying the source gas in a high temperature state, wherein the wafer container comprises a single material or a single member, and has a ratio $R_2/R_1$ which is not less than 0.4 and not more than 1.0, where $R_1$ is a heat resistance for a heat transfer route from a rear surface of the wafer container toward the front surface of the wafer, and $R_2$ is a heat resistance for a heat transfer route from the rear surface of the wafer container toward a front surface of the wafer container.

Referring now to a schematic view of heat resistances in the wafer 2 and wafer holder 3 shown in FIG. 3, the heat resistance $R_1$ for the heat transfer route from the rear surface of the wafer holder 3 toward the front surface of the wafer 2 is the sum of the heat resistance $R_{1c}$ for the portion of wafer holder 3, the contact heat resistance $R_{1g}$ between the wafer holder 3 and wafer 2, and the heat resistance $R_{1w}$ for the portion of wafer 2; and the heat resistance $R_2$ for the heat transfer route from the rear surface of the wafer holder 3 toward the front surface thereof is the heat resistance $R_{2c}$ for the portion of wafer holder 3.

This almost equalizes the heat resistances for the individual heat transfer routes to each other and thus ensures similar heat transfer during heat transfer from the rear surface of the wafer container toward the front surfaces of the wafer and of the wafer container, and this consequently equalizes achievable temperatures of the surfaces of the wafer and of the wafer container. This successfully prevents the surface temperature at the circumferential portion of the wafer from rising higher than the surface temperature at the center of the wafer which is caused by temperature difference between the surfaces of the wafer and the wafer container, and makes it possible to keep a uniform in-plane temperature distribution of the wafer. As a consequence, a thin film having a desirable uniformity can be grown in the vapor phase over the entire surface of the wafer.

More specifically, the wafer container preferably is made of a material having a coefficient of thermal conductivity close to that of the wafer to be disposed on the wafer container. Although not being specifically limited, any materials may be available for fabrication of the wafer container so far as they have a characteristic of not being a pollutant in thin film growth or in the atmosphere of the reactor. For example, amorphous carbon (coefficient of thermal conductivity: 10 W/m·K) and aluminum nitride (coefficient of thermal conductivity: 40 to 50 W/m·K) are suitable as a material for the wafer container since their coefficients of thermal conductivity are more close to that of the wafer than the conventional graphite (100 W/m·K at 600° C.).

Further more preferably, the wafer container is made of a material having a coefficient of thermal conductivity which is not less than 0.5 times that of the wafer to be located thereon and not more than 2 times that of the wafer. This successfully makes heat resistance ratio $R_2/R_1$ closer to 1 without thickening the wafer container, so that dimensional expansion of the apparatus is avoidable. For an exemplary case of using an InP wafer having a coefficient of thermal conductivity of 14.3 W/m·K at 600° C., the wafer container only have to be composed of a material having a coefficient of thermal conductivity of 7.15 to 28.6 W/m·K (e.g., amorphous carbon).

Next, the progress that the present invention has been developed will be described, as follows.

As for a reason why the surface temperature of the wafer 2 tends to become lower than that of the wafer holder 3, the present inventors placed a focus on the difference between heat transfer routes inside the wafer 2 and wafer holder 3. That is, the present inventors considered that because the wafer 2 and wafer holder 3 generally differs from each other in materials, so that the same heat transfer cannot be performed in the routes, it causes a difference between achievable surface temperatures of the wafer and the wafer holder.

FIG. 3 is a schematic view showing heat resistances in the wafer 2 and wafer holder 3. In FIG. 3, $T_{up}$ denotes rear surface temperature of the wafer holder 3, $T_{surf}$ denotes surface temperature of the wafer 2 or wafer holder 3, and $T_{down}$ denotes a temperature at an imaginary plane (referred to as "virtual boundary plane", hereinafter) set at a position away from the surfaces of the wafer 2 and wafer holder 3 by a predetermined distance. As shown in FIG. 3, heat transfer toward the front surface of the wafer 2 is established along a heat transfer route 1 which originates from the rear surface of the wafer holder 3 and is directed through the wafer holder 3 itself and the wafer 2 to reach the virtual boundary plane, and heat transfer toward the front surface of the wafer holder 3 is established along a heat transfer route 2 which originates from the rear surface of the wafer holder 3 and is directed through the wafer holder 3 itself to reach the virtual boundary plane. As described above, the wafer 2 and wafer holder 3 differ from each other in the heat transfer route toward the respective surfaces thereof.

That is, as known from the schematic view of heat resistance of the wafer 2 and wafer holder 3 shown in FIG. 3, the heat resistance $R_1$ for the heat transfer route 1 is equal to the sum of heat resistance $R_{1c}$ for the portion of wafer holder 3, the contact heat resistance $R_{1g}$ between the wafer holder 3 and wafer 2, and the heat resistance $R_{1w}$ for the portion of wafer 2; and the heat resistance $R_2$ for the heat transfer route 2 is equal to the heat resistance $R_{2c}$ for the portion of wafer holder 3.

By the way, heat resistance R is given by the equation (1) below:

$$R = L/k \quad (1)$$

$R[m^2K/W]$: a heat resistance
$L[m]$: a thickness of a material in the direction of heat flow
$k[W/m·K]$: a coefficient of thermal conductivity.

Heat resistances $R_1$ and $R_2$ are then expressed by the equations below:

$$R_1 = R_{1c} + R_{1g} + R_{1w} = L_c/k_{1c} + R_{1g} + L_w/k_{1w} \quad (2)$$

$$R_2 = R_{2c} = L_c/k_{2c} + L_w/k_{2c} \quad (3)$$

$(k_{1c} = k_{2c})$

It is to be noted now that a relation can be written as $L_w/k_{1w} > L_w/k_{2c}$ because coefficient of thermal conductivity $k_{1w}$ of the wafer 2 (InP, GaAs, etc.) is extremely smaller than coefficient of thermal conductivity $k_{2c}$ of the wafer holder 3 (graphite, molybdenum, etc.), and contact heat resistance $R_{1g}$ arises at the contact plane between the wafer 2 and wafer holder 3, so that $R_2$ is apparently smaller than $R_1$.

$$R_1 > R_2 \quad (4)$$

It is also known that heat transfer is subject to heat flux in the heat transfer route. The heat flux generally refers to as the amount of energy (heat flow) flowing in a unit area (unit: $m^2$), and is given by the equation (5) below:

$$q = -1/R_{total}(T_{down} - T_{up}) \quad (5)$$

$q[W/m^2]$: a heat flux, $R_{total}[m^2K/W]$ is an overall heat resistance
$T_{up}[K]$: an upstream temperature
$T_{down}[K]$: a downstream temperature.

In FIG. 3, overall heat resistances $R_{1total}$ and $R_{2total}$ in the heat transfer routes 1 and 2 are given by the equations below:

$$R_{1total} = R_1 + R_{1a} \quad (6)$$

$$R_{2total} = R_2 + R_{2a} \quad (7)$$

(where, $R_{1a} = R_{2a}$)

The foregoing equations (4), (6) and (7) give a relation of $R_{1total} > R_{2total}$. Therefore, the heat flux $q_1$ in the heat transfer route 1 becomes smaller than the heat flux $q_2$ in the heat transfer route 2.

$$q_2 > q_1 \quad (8)$$

Furthermore, the heat fluxes $q_1$ and $q_2$ can be represented as the equations below using the surface temperature $T_{1surf}$ of the wafer 2 and the surface temperature $T_{2surf}$ of the wafer holder 3:

$$q_1 = -(T_{down} - T_{1surf})/R_{1a} \quad (9)$$

$$q_2 = -(T_{down} - T_{2surf})/R_{2a} \quad (10)$$

It is derived from the foregoing equations (8), (9) and (10) that the surface temperature $T_{1surf}$ of the wafer 2 is lower than the surface temperature $T_{2surf}$ of the wafer holder 3.

$$T_{2surf} > T_{1surf} \quad (11)$$

It was thus found that, in the conventional vapor-phase growth apparatus, the difference between the surface temperatures $T_{1surf}$ and $T_{2surf}$ is caused by a large difference in the coefficients of thermal conductivity between the wafer 2 and wafer holder 3.

The present inventors therefore studied a method of reducing the difference between the surface temperature $T_{1surf}$ of the wafer 2 and the surface temperature $T_{2surf}$ of the wafer holder 3, and based on the above equations (5) through (10), we reached an idea that close equalization of the heat resistances $R_1$ and $R_2$ in the individual heat transfer routes would be successful (that is, to set heat resistance ratio $R_2/R_1$ close to 1).

The present invention is completed based on the aforementioned findings, and is to provide a vapor-phase growth apparatus 100 in which, for the case where the wafer holder 3 is composed of a single material or a single member, a ratio $R_2/R_1$, where $R_1$ is heat resistance for a heat transfer route from the rear surface of the wafer container towards the surface of the wafer, and $R_2$ is heat resistance for a heat transfer route from the rear surface of the wafer container towards the surface of the wafer container, is adjusted within a range from 0.4 to 1.0.

Although the heat resistance ratio $R_2/R_1$ can be approximated to 1 also by raising a value of $L_c$ in the equations (2) and (3), this is less feasible due to problems in temperature control, in space efficiency of the apparatus and in costs, so that a material of the wafer holder 3 was selected such as one having a coefficient of thermal conductivity close to that of the wafer 2, as a more practical strategy.

BEST MODE FOR CARRYING OUT THE INVENTION

An embodiment of the vapor-phase growth apparatus (MOCVD apparatus) of the present invention will be described below referring to the attached drawings.

Figure 1:
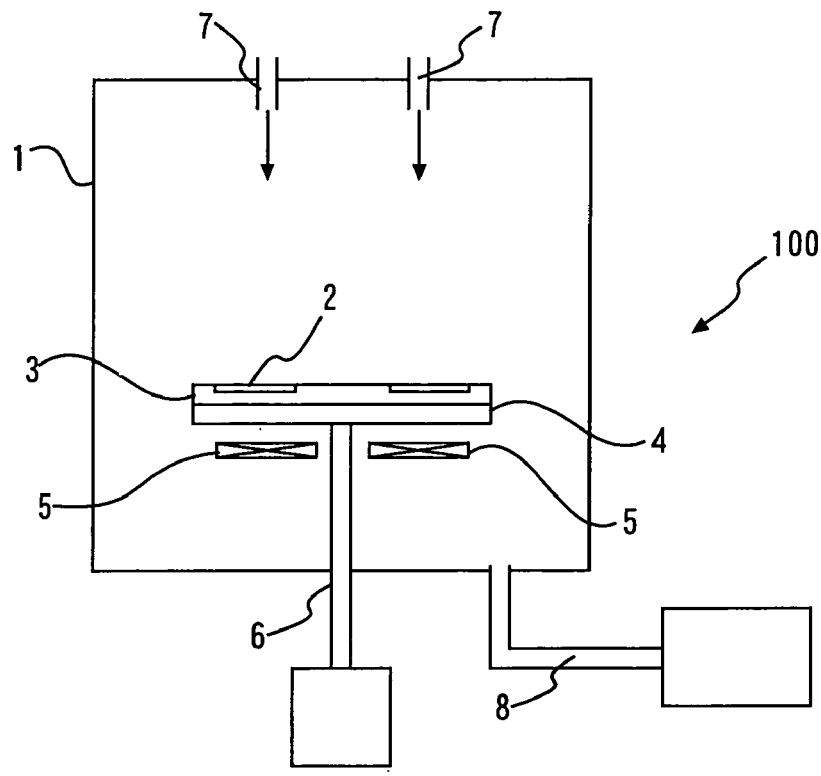
FIG. 1 is a sectional view showing a schematic construction of a general vapor-phase apparatus.
Figure 2:
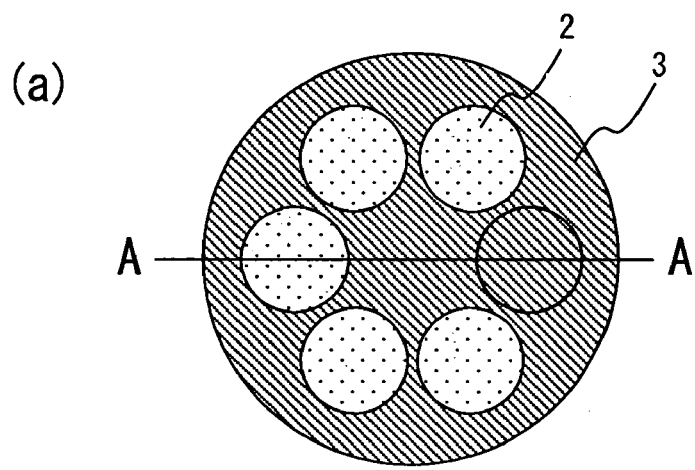
FIG. 2 is an enlarged view showing a detailed construction of the wafer holder 3 which is composed of a single material or a single member, where (a) is a plan view, and (b) is a sectional view taken along the line A-A.
Figure 2:
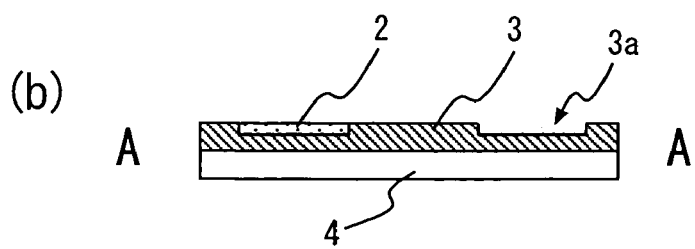
Figure 3:
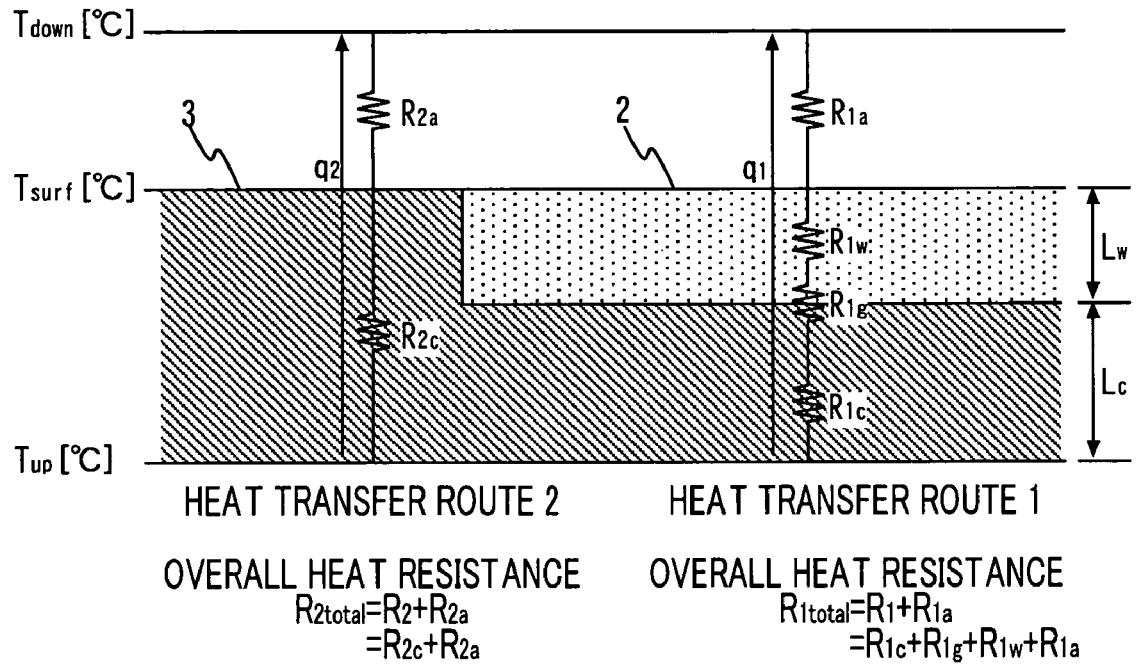
FIG. 3 is a schematic view for explaining heat resistance of the wafer 2 and wafer holder 3 in the case where the wafer holder 3 is composed of a single material or a single member.

FIG. 1 is a sectional view showing a schematic construction of the vapor-phase apparatus according to the present embodiment. FIG. 2 is an enlarged view showing a detailed construction of the wafer holder 3 which is composed of a single material or a single member, where (a) is a plan view, and (b) is a sectional view taken along the line A-A.

The schematic construction of the vapor-phase apparatus of the first embodiment is similar to that described in the Background Art. However, the vapor-phase apparatus of the first embodiment is different from the earlier technology described in the Background Art in that amorphous carbon (abbreviated as a-carbon, hereinafter) was used as a material for the wafer holder 3 in the first embodiment of the present invention although a material having a large coefficient of thermal conductivity, such as graphite, is used in the earlier technology.

As shown in FIG. 1, the vapor-phase growth apparatus 100 comprises a reaction furnace 1, a wafer holder 3 for disposing wafers 2 thereon, a susceptor 4 for placing the wafer holder 3 thereon, a heater 5 disposed below the susceptor 4, a rotary mechanism 6 for supporting the wafer holder 3 and the susceptor 4 to allow them to rotate freely, a gas introducing duct 7 for supplying a source gas and a carrier gas therethrough, and a gas exhaust duct 8 for discharging the non-reacted gas, and the like.

Each of wall members of the vapor-phase growth apparatus 100 is typically made of a stainless steel. The gas introducing duct 7 is disposed at the vicinity of the center portion of the upper wall member, and introduces a Group XIII (IIIB) source gas such as trimethyl indium (TMI), trimethyl aluminum (TMAl) or trimethyl gallium (TMG); a Group XV (VB) source gas such as arsine ($AsH_3$) or phosphine ($PH_3$); and an inert gas such as hydrogen ($H_2$) as a carrier gas, into the reaction furnace.

The wafer holder 3 which is made of a-carbon and formed in a disk shape, is placed on the upper surface of susceptor 4. In a surface of the wafer holder 3, a plurality of (six in FIG. 2) circular pocket holes (recesses) 3a for disposing the wafers 2 therein, are formed along a single circumference. The susceptor 4 is composed of a material having a large coefficient of thermal conductivity (e.g. molybdenum) in order to uniformly transfer heat from the heater 5, and is supported by the rotary mechanism 6 in a freely rotatable manner. Below the susceptor 4, the heater 5 for heating the wafer 2 is concentrically arranged.

Although it was a general practice to use graphite or molybdenum having a large coefficient of thermal conductivity, as a material for the wafer holder 3 in the earlier developed vapor-phase growth apparatus, a-carbon is used for the wafer holder 3 in the present embodiment. That is, by using a-carbon having a coefficient of thermal conductivity of 10 W/m·K in place of graphite having a coefficient of thermal conductivity of 100 W/m·K, the coefficient of thermal conductivity of the wafer 2 placed on the wafer holder 3 and the coefficient of thermal conductivity of the wafer holder 3 come to be approximately equal to each other. Because the coefficient of thermal conductivity of an InP wafer is 14.3 W/m·K, the coefficient of thermal conductivity of a-carbon can be estimated as approximately 0.7 times thereof.

As described above, because a-carbon has a coefficient of thermal conductivity close to that of the wafer 2 located thereon in the present embodiment, the heat resistances become equivalent in both heat transfer routes from the heater 5 through the susceptor 4 and wafer holder 3, toward the front surface of the wafer 2 and toward the front surface of the wafer holder 3, and this makes the front surfaces of the wafer 2 and wafer holder 3 reach almost the same temperature. This successfully prevents the surface temperature at the peripheral portion of each wafer from raising higher than the surface temperature at the center of each wafer which may be caused by existing a large difference between the front surface temperatures of the wafer and the wafer container. As a result, it is possible to facilitate obtaining a uniform in-plane temperature distribution of the wafer 2.

The gas exhaust duct 8 is disposed at the bottom surface of the reaction furnace 1. A source gas introduced into the reaction furnace 1 from an introduction port through the gas introducing duct 7 is decomposed in the upstream side of the reaction furnace, and is then flown to the downstream side to form a thin film on the wafers 2. The non-reacted source gas is discharged out through an exhaust port and the gas exhaust duct 8, together with the carrier gas.

Although not shown in the drawings, water-cooled jackets are provided typically on the outer periphery of the rotary mechanism 6 and on the lower outside wall of the reaction furnace. These water-cooled jackets and heater 5 control the temperature inside the reaction furnace 1.

In the vapor-phase growth apparatus 100 having the above-described construction, heat is transferred to the wafer 2 through the susceptor 4 and the wafer holder 3 under heating of the susceptor 4 from the lower side thereof by using heater 5, to thereby heat the wafer 2 to a predetermined temperature. Vapor-phase growth of a thin film is carried out by rotating the susceptor 4 at a predetermined number of rotation with the aid of a rotating mechanism 6 while uniformly supplying a source gas and carrier gas introduced through a gas introducing duct 7 toward the upper surface of the wafers 2. Since temperatures of the upper surface of the wafer 2 and the upper surface of the wafer holder 3 herein become almost equivalent, the in-plane temperature distribution of the wafer 2 becomes uniform, and this allows vapor-phase growth of a thin film having an excellent uniformity.

Hereinafter, simulation results of heat transfer examined using the vapor-phase growth apparatus of the embodiment will be described, in order to clarify specific features of the present invention. Also a similar simulation of heat transfer using the earlier developed vapor-phase growth apparatus was carried out as a comparative embodiment.

In the simulation, the wafer 2 and the vicinity thereof in the vapor-phase growth apparatus 100 were modeled, and three-dimensional heat transfer analysis based on the finite volume method was carried out. An a-carbon-made wafer holder 3 was used in the embodiment, and a graphite-made wafer holder 3 was used in a comparative embodiment.

Figure 4:
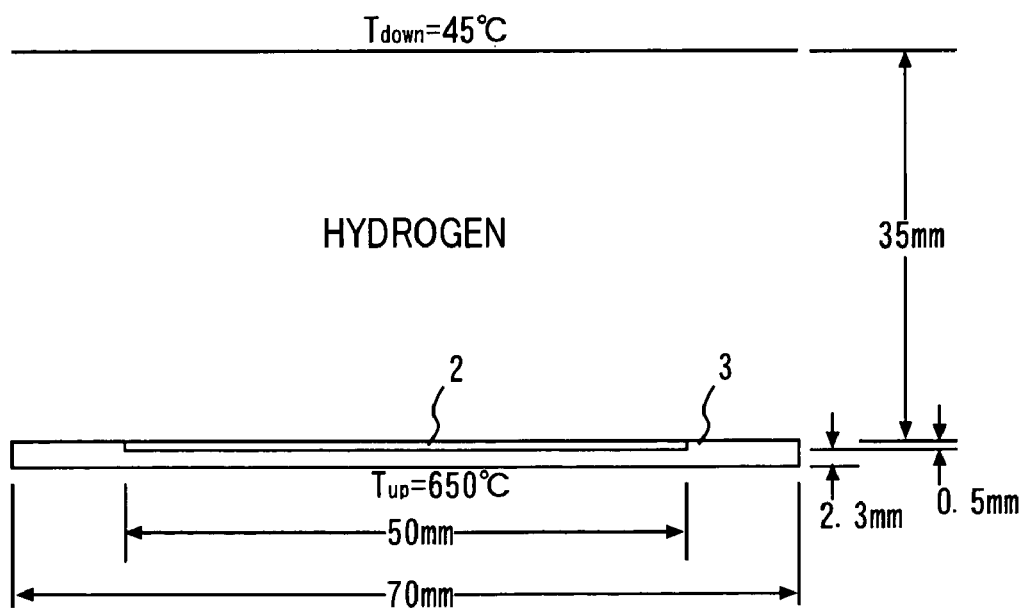
FIG. 4 is a schematic analytical model view showing a region around the wafer 2 and wafer holder 3 of the vapor-phase growth apparatus 100 according to an embodiment.

FIG. 4 is a schematic analytical model view showing a region around the wafer 2 and wafer holder 3 (showing an outward width of 10 mm from the periphery of wafer) of the vapor-phase growth apparatus 100 according to the embodiment. As shown in FIG. 4, a distance from the bottom surface of the wafer holder 3 to the wafer 2 was defined as 2.3 mm. The wafer 2 was an InP wafer having a thickness of 0.5 mm and an inner diameter of 50 mm (2 inches), and the reaction furnace 1 was conditioned to have a hydrogen atmosphere. The number of meshes for the analysis was set to about 6,000,000 meshes.

The contact heat resistance ($R_{1g}$) between the wafer 2 and wafer holder 3 was defined as $2.0 \times 10^{-4}$ m$^2$K/W. It is to be noted that the contact heat resistance $R_{1g}$ is affected by the flatness, surface roughness and coefficient of thermal diffusion of the material, of the members to be brought into contact with each other, and it can further be reduced by reducing the distance between the contact planes.

The analytical conditions further included boundary conditions of 45° C. for the virtual boundary plane located 35 mm above the wafer 2, and of 650° C. for the boundary (rear surface) of the wafer holder 3. In the heat transfer analysis of this model, hydrogen was approximately assumed as a solid, since hydrogen having a small Prandtl number shows thermal diffusion which prevails over viscous diffusion, and since effects of advection is negligible in a region having a relatively small Reynolds number in the laminar flow region.

The following physical property values shown in Table 1 were used for the present analysis.

TABLE 1

|  | HYDROGEN | GRAPHITE (COMPARATIVE EXAMPLE) | a-CARBON (EXAMPLE) | InP |
|---|---|---|---|---|
| DENSITY [kg/m$^3$] | 0.00259 | 2000 | 1550 | 4787 |
| SPECIFIC HEAT [J/kgK] | 14500 | 1000 | 1000 | 368 |
| COEFFICIENT OF THERMAL CONDUCTIVITY [W/m · K] | 0.4048 | 100 | 10 | 14.3 |

Figure 5:
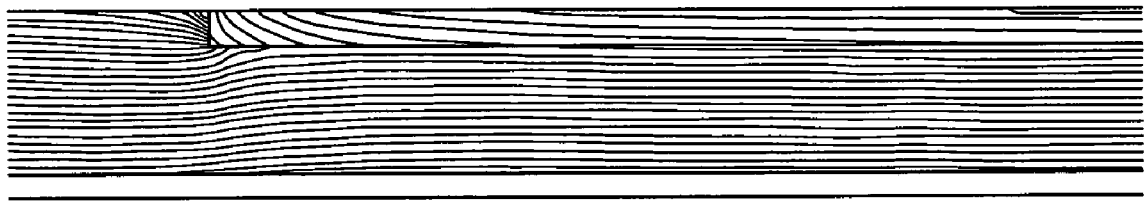
FIG. 5 shows an analytical result of temperature distribution inside the wafer and wafer holder in the embodiment where an a-carbon-made wafer holder is used.
Figure 6:
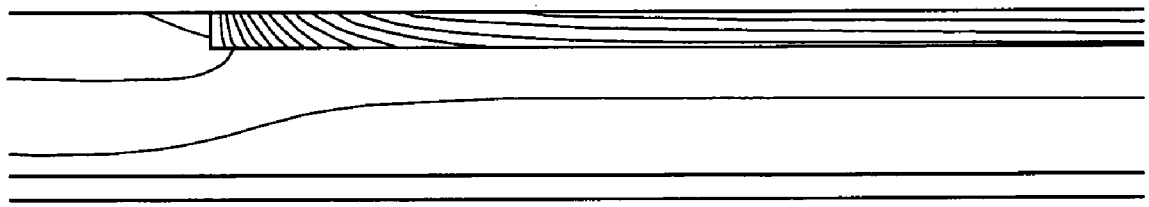
FIG. 6 shows an analytical result of temperature distribution inside the wafer and wafer holder in a comparative embodiment where a graphite-made wafer holder is used.

FIG. 5 shows an analytical result of temperature distribution within the wafer 2 and wafer holder 3 in an Example where an a-carbon-made wafer holder 3 is used, and FIG. 6 shows an analytical result in a Comparative Example. It is to be noted that FIGS. 5 and 6 show enlarged views of the boundary portion between the wafer 2 and wafer holder 3 in order to clarify the analytical results.

Figure 7:
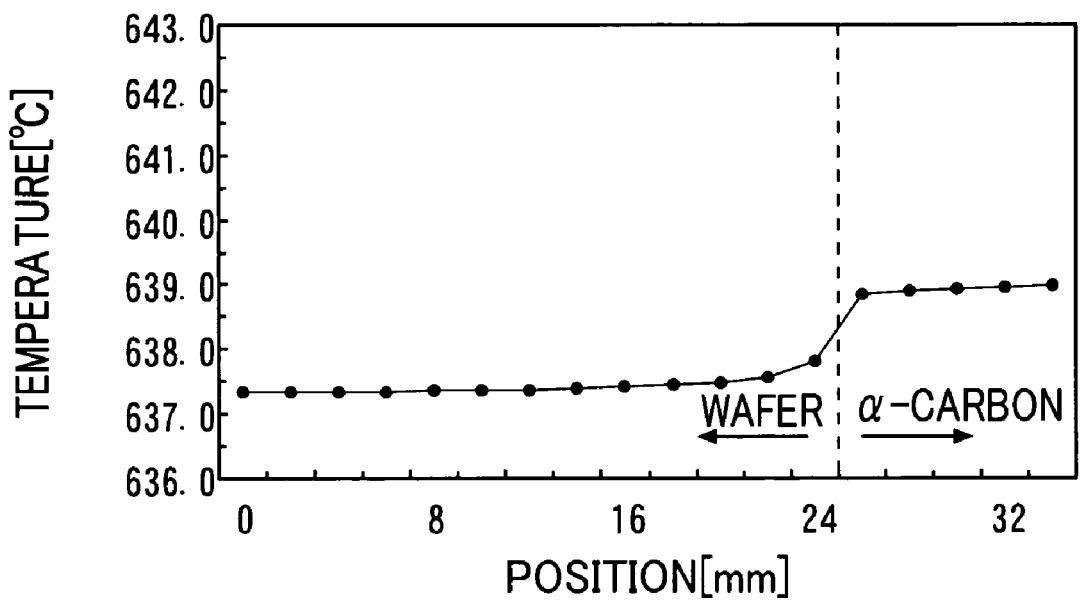
FIG. 7 shows analytical results of surface temperature distribution of the wafer 2 and wafer holder 3 in the embodiment.
Figure 8:
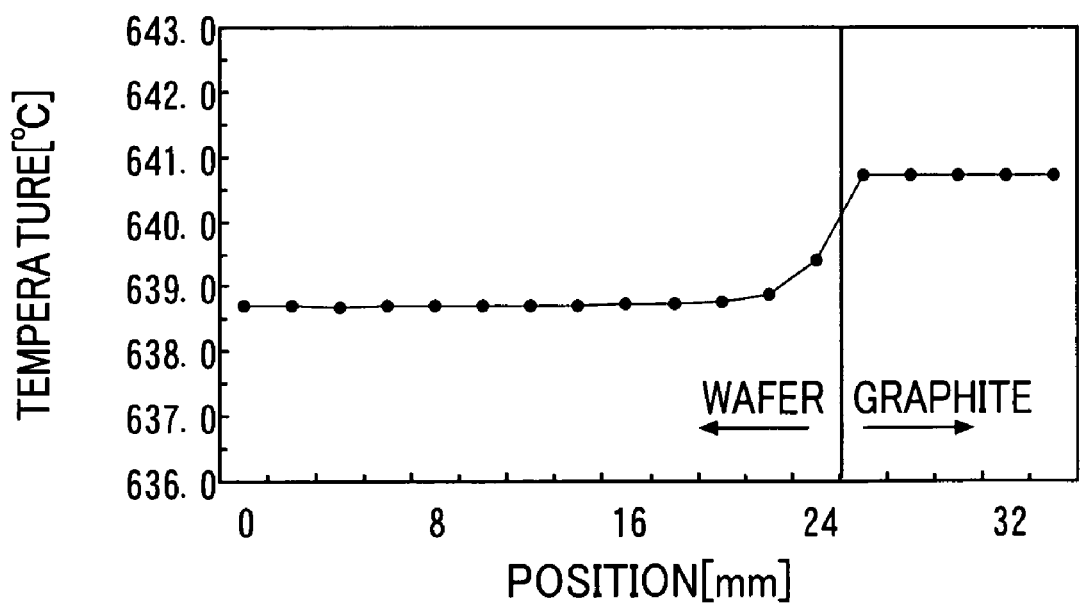
FIG. 8 shows analytical results of surface temperature distribution of the wafer 2 and wafer holder 3 in the comparative embodiment.

FIG. 7 shows analytical results of surface temperature distribution of the wafer 2 and wafer holder 3 in the Example, and FIG. 8 shows analytical results of surface temperature distribution of the wafer 2 and wafer holder 3 in the Comparative Example. It is to be noted that FIGS. 7 and 8 show the surface temperature measured at positions along the direction of diameter difining the center of the wafer as zero.

In the Example, as shown in FIG. 5, a large temperature gradient is found in the propagation direction of heat flow (rear surface front surface→of the wafer holder 3), but the temperature gradients in the wafer 2 and wafer holder 3 are almost equivalent. On the other hand in Comparative Example, as shown in FIG. 6, a large temperature gradient is found in the wafer 2 but a relatively moderate temperature gradient is found in the wafer holder 3. This indicates that, in Example, similar heat transfer is established even if the heat transfer route differs.

Heat resistance ratio $R_2/R_1$ was found to be 0.554 in Example, but 0.091 in Comparative Example.

It was also found for Example shown in FIG. 7 that the surface temperature of the wafer was 637.4° C., the surface temperature of the wafer holder was 639.0° C., showing a difference between the two of about 1.6° C., whereas it was found for Comparative Example shown in FIG. 8 that the surface temperature of the wafer was 638.7° C., the surface temperature of the wafer holder was 641.0° C., that is, the difference between them is about 2.3° C. It was thus made clear that Example showed a smaller difference in the surface temperatures between the circumferential portion (22 to 25 mm) and the central portion (around 0) of the wafer 2, and that the in-plane temperature distribution of the wafer 2 was improved to attain uniformity.

As described above, Example was successful in keeping uniformity of the in-plane temperature distribution of the wafer 2 because the surface temperature in the circumferential portion of the wafer 2 became less likely to be affected by the surface temperature of the wafer holder 3. As a result, the present invention is suitable for proceeding vapor-phase growth of a thin film which has a desirable uniformity over the entire surface of the wafer.

According to the present embodiment, because the vapor-phase growth apparatus 100 was designed so that the wafer container has a ratio $R_2/R_1$ which is not less than 0.4 and not more than 1.0, where $R_1$ is a heat resistance for a heat transfer route from a rear surface of the wafer container toward the front surface of the wafer, and $R_2$ is a heat resistance for a heat transfer route from the rear surface of the wafer container toward a front surface of the wafer container, it is possible to make the heat resistances through the heat transfer routes approximately equal to each other. That is, approximately the same achievable surface temperatures for the wafer and the wafer container can be obtained because of performing heat transfers for the above routes by approximately similar heat flux.

This successfully lowers that the surface temperature at the center of the wafer affects the surface temperature at the circumferential portion of the wafer, and makes it possible to keep a uniform in-plane temperature distribution of the wafer. As a result, a thin film having a desirable uniformity can be grown in vapor phase over the entire surface of the wafer.

INDUSTRIAL APPLICABILITY

Although the foregoing paragraphs explained the present invention conceived by the present inventors mainly referring to a vertical high-speed-rotating-type of vapor-phase growth apparatus on which the background of the invention stands, the present invention is not limited to the above type, and is also applicable to any general vapor-phase growth apparatuses such as those based on face-down system, lateral type, autorotation/revolution system, and the like.

The present invention is applicable not only to the case where InP wafer is used, but also to cases where a thin film is grown on wafers made of such as Si, GaAs, GaN, sapphire, glass, ceramic, and the like. In these cases, it is also allowable to alter a material composing the wafer holder 3 depending on the wafer to be used.

The invention claimed is:

1. A vapor-phase growth apparatus comprising:
   a reaction furnace which can be hermetically closed,
   a wafer container which is disposed in the reaction furnace, for disposing a wafer at a predetermined position,
   a gas supply member for supplying a source gas toward the wafer, and
   a heating member for heating the wafer,
wherein
   the apparatus is designed to form a grown film on a front surface of the wafer by supplying the source gas in a high temperature state while the heating member heats the wafer through the wafer container in the reaction furnace,
   the wafer container is made of a single material or a single member,
   a pocket hole in which the wafer is disposed is formed on a front surface of the wafer container,
   the wafer is disposed in said pocket hole, and
   a ratio $R_2/R_1$ is not less than 0.4 to not more than 1.0, where $R_1$ is a heat resistance for a heat transfer route from a rear surface of the wafer container toward the front surface of the wafer, and $R_2$ is a heat resistance for a heat transfer route from the rear surface of the wafer container toward a front surface of the wafer container.

2. The vapor-phase growth apparatus as claimed in claim 1, where in the wafer container is made of a material having a coefficient of thermal conductivity which is not less than 0.5 times that of the wafer and not more than 2 times that of the wafer.

3. The vapor-phase growth apparatus as claimed in claim 1, wherein the wafer container is made of amorphous carbon.

4. The vapor-phase growth apparatus as claimed in claim 2, wherein the wafer container is made of amorphous carbon.

* * * * *